(12) United States Patent
Sakai et al.

(10) Patent No.: US 7,781,791 B2
(45) Date of Patent: Aug. 24, 2010

(54) SEMICONDUCTOR LIGHT EMITTING ELEMENT

(75) Inventors: Mitsuhiko Sakai, Kyoto (JP); Tadahiro Okazaki, Kyoto (JP); Ken Nakahara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/224,524

(22) PCT Filed: Feb. 22, 2007

(86) PCT No.: PCT/JP2007/053306

§ 371 (c)(1),
(2), (4) Date: Aug. 28, 2008

(87) PCT Pub. No.: WO2007/099855

PCT Pub. Date: Sep. 7, 2007

(65) Prior Publication Data

US 2009/0026468 A1    Jan. 29, 2009

(30) Foreign Application Priority Data

Feb. 28, 2006 (JP) .............................. 2006-051596
Mar. 22, 2006 (JP) .............................. 2006-078624

(51) Int. Cl.
*H01L 33/00* (2010.01)
(52) U.S. Cl. .............................. 257/98; 257/95; 257/79; 257/E33.001
(58) Field of Classification Search .................... 257/95, 257/98, 79, E33.001
See application file for complete search history.

(56) References Cited

U.S. PATENT DOCUMENTS 5,779,924 A * 7/1998 Krames et al. ................ 216/24

(Continued)

FOREIGN PATENT DOCUMENTS

JP    10-012916    1/1998

(Continued)

*Primary Examiner*—Tan N Tran
(74) *Attorney, Agent, or Firm*—Hamre, Schumann, Mueller & Larson, P.C.

(57) ABSTRACT

In a semiconductor light emitting element, a p-type layer (220), an active layer (230) and an n-type layer (240) are laminated on a substrate in this order. The n-type layer (240) is formed with a rectangular n-side electrode (241) whose width in one direction is equal to that of the n-type layer (240). The thickness t of the n-type layer (240) satisfies Formula 1 below. The semiconductor light emitting element includes a side surface (270) extending in the lamination direction and formed with a plurality of projections (271). Supposing that the wavelength of the light from the active-layer (230) is λ and the index of refraction of the n-type layer (240) or the p-type layer (220) is n, the average $W_A$ of widths at bottoms of the projections is set to satisfy $W_A \geq \lambda/n$.

$$t \geq \frac{\rho J_0 e}{4\gamma\kappa_B T} \cdot W(L-W) \quad \text{Formula 1}$$

where
L is width of the n-type layer in a direction different from the one direction,
T is absolute temperature,
W is width of the n-side electrode in a direction different from the one direction,
$J_0$ is current density at the contact portion between the n-side electrode and the n-type layer,
e is elementary charge,
γ is diode ideality factor,
$\kappa_B$ is Boltzmann constant,
ρ is specific resistance of the n-type semiconductor layer.

6 Claims, 10 Drawing Sheets

U.S. PATENT DOCUMENTS

| | | |
|---|---|---|
| 6,091,085 A | 7/2000 | Lester |
| 2001/0032985 A1 | 10/2001 | Bhat et al. |
| 2003/0122478 A1 | 7/2003 | Suehiro et al. |
| 2003/0150843 A1 | 8/2003 | Doi et al. |
| 2005/0093008 A1 | 5/2005 | Suehiro et al. |

FOREIGN PATENT DOCUMENTS

| | | | |
|---|---|---|---|
| JP | 10-150220 | | 6/1998 |
| JP | 10-200156 | | 7/1998 |
| JP | 11-251629 | | 9/1999 |
| JP | 11-274568 | | 10/1999 |
| JP | 2000-091638 | | 3/2000 |
| JP | 2002-280608 | | 9/2002 |
| JP | 2002-319708 | | 10/2002 |
| JP | 2003-110136 | * | 4/2003 |
| JP | 2003-168820 | | 6/2003 |
| JP | 2005-191514 | | 7/2005 |

* cited by examiner

SEMICONDUCTOR LIGHT EMITTING ELEMENT

TECHNICAL FIELD

The present invention relates to a semiconductor light emitting element including a semiconductor layer.

BACKGROUND ART

Conventionally, a semiconductor light emitting element including a plurality of semiconductor layers containing GaN and laminated on a sapphire substrate has been proposed (see e.g. Patent Document 1).

In a known method for manufacturing a semiconductor light emitting element, after semiconductor layers are formed on a sapphire substrate, a support substrate is bonded to the semiconductor layers on the side opposite from the sapphire substrate. Then, the sapphire substrate is removed utilizing heat generated by laser beam irradiation (see Patent Document 2, for example). FIG. 20 shows an example of semiconductor light emitting element manufactured by such a method. In the semiconductor light emitting element X shown in the figure, a p-GaN layer 92, an active layer 93 and an n-GaN layer 94 as semiconductor layers are laminated on a support substrate 91 formed with a p-side electrode 91a. The upper surface of the n-GaN layer 94 is formed with an n-side electrode 94a. The active layer 93 amplifies the light emitted by the recombination of electrons injected from the n-GaN layer 94 and holes injected from the p-GaN layer 92. For instance, the active layer 93 has a Multiple Quantum Well (hereinafter referred to as "MQW") structure. The semiconductor light emitting element X is designed to emit light from the upper surface of the n-GaN layer 94 and the side surface 97 of the n-GaN layer 94, active layer 93 and p-GaN layer 92.

Patent Document 1: JP-A-10-012916
Patent Document 2: JP-A-2003-168820

However, due to the potential difference in the thickness direction of the n-GaN layer 94, the electrons injected from the n-side electrode 94a are likely to pass through the n-GaN layer 94. Thus, sufficient current does not flow to the end of the n-GaN layer 94. Thus, it is difficult to cause the recombination of electrons and holes to occur at the entire region of the active layer 93. As a result, in the semiconductor light emitting element X, the efficient light emission for the power applied is difficult, so that high brightness is not achieved.

Moreover, GaN, which forms the n-GaN layer 94, the active layer 93 and the p-GaN layer 92, has a relatively high index of refraction of about 2.5. Thus, the critical angle with respect to air is about 23°, which is relatively small. The light rays which become incident on the side surface 97 at an angle larger than this critical angle are totally reflected and not emitted to the outside of the semiconductor light emitting element X. Thus, in the semiconductor light emitting element X, only a small part of light produced by the active layer 93 is emitted to the outside, so that high brightness is not achieved.

DISCLOSURE OF THE INVENTION

Problems to be Solved by the Invention

The present invention has been proposed under the circumstances described above. It is, therefore, an object of the present invention is to provide a semiconductor light emitting element which provides high brightness due to an increased light emission amount and an increased ratio of light to be emitted to the outside.

Means for Solving the Problems

According to a first aspect of the present invention, there is provided a semiconductor light emitting element comprising a substrate, a p-type semiconductor layer supported by the substrate, an n-type semiconductor layer arranged at a position farther from the substrate than the p-type semiconductor layer is and an active layer arranged between the p-type semiconductor layer and the n-type semiconductor layer. The n-type semiconductor layer is formed with a rectangular n-side electrode whose width in one direction is equal to that of the n-type semiconductor layer. The n-type semiconductor layer has a thickness t which satisfies Formula 1 given below. The semiconductor light emitting element includes a side surface extending in a lamination direction and formed with a plurality of projections. When the wavelength of the light emitted from the active layer is expressed by $\lambda$ and the index of refraction of either one of the n-type semiconductor layer and the p-type semiconductor layer is expressed by n, the average $W_A$ of widths at bottoms of the projections satisfies $W_A \geq \lambda/n$.

$$t \geq \frac{\rho J_0 e}{4\gamma \kappa_B T} \cdot W(L-W) \qquad \text{Formula 1}$$

where

L is width of the n-type semiconductor layer in a direction which is different from the one direction, T is absolute temperature, W is width of the n-side electrode in a direction which is different from the one direction, $J_0$ is current density at a contact portion between the n-side electrode and the n-type semiconductor layer, e is elementary charge, $\gamma$ is diode ideality factor, $\kappa_B$ is Boltzmann constant, and $\rho$ is specific resistance of the n-type semiconductor layer.

According to a second aspect of the present invention, there is provided a semiconductor light emitting element comprising a substrate and an n-type semiconductor layer, an active layer and a p-type semiconductor layer which are laminated on the substrate. The semiconductor light emitting element includes a side surface extending in the lamination direction and formed with a plurality of projections. When the wavelength of the light emitted from the active layer is expressed by $\lambda$ and the index of refraction of either one of the n-type semiconductor layer and the p-type semiconductor layer is expressed by n, the average $W_A$ of widths at bottoms of the projections satisfies $W_A \geq \lambda/n$.

In a preferred embodiment, at least either one of the n-type semiconductor layer and the p-type semiconductor layer is made of GaN. In this case, by employing an n-GaN layer or a p-GaN layer as the n-type semiconductor layer or the p-type semiconductor layer, the amount of light emission relative to the applied power increases. Although GaN has a relatively high index of refraction, the provision of the projections whose average width $W_A$ satisfies the above-described Formula prevents the light from the active layer from being totally reflected.

In a preferred embodiment, the projections extend in the lamination direction and are triangular or semicircular in cross section. The projections having this structure are capable of causing the light from the inside to be properly emitted to the outside.

According to a third aspect of the present invention, there is provided a semiconductor light emitting element comprising a substrate, a p-type semiconductor layer supported by the substrate, an n-type semiconductor layer arranged at a position farther from the substrate than the p-type semiconductor layer is, and an active layer arranged between the p-type semiconductor layer and the n-type semiconductor layer. The n-type semiconductor layer is formed with a circular n-side electrode. The n-type semiconductor layer has a thickness t which satisfies Formula 2:

$$t \geq \frac{\rho J_0 e W^2}{8\gamma \kappa_B T} \cdot \log\left(\frac{L}{W}\right) \quad \text{Formula 2}$$

where

L is representative length of the semiconductor light emitting element,

T is absolute temperature,

W is diameter of the n-side electrode, $J_0$ is current density at a contact portion between the n-side electrode and the n-type semiconductor layer, e is elementary charge, γ is diode ideality factor, $\kappa_B$ is Boltzmann constant, and ρ is specific resistance of the n-type semiconductor layer.

It is to be noted that the "representative length" of the semiconductor light emitting element in the present invention refers to the diameter in the case of a circular shape and the length of one side in the case of a rectangular shape.

In a preferred embodiment, the n-type semiconductor layer is formed with a plurality of projections, and the thickness t of the n-type semiconductor layer satisfies Formula 3 instead of Formula 2:

$$t \geq \frac{\rho J_0 e W^2}{8\gamma \kappa_B T} \cdot \log\left(\frac{L}{W}\right) + x \quad \text{Formula 3}$$

where 0.1 μm ≦ x ≦ 3.0 μm.

In a preferred embodiment, the n-type semiconductor layer is made of n-GaN. With this arrangement, the semiconductor light emitting element is capable of emitting blue light or green light.

According to a fourth aspect of the present invention, there is provided a semiconductor light emitting element comprising a substrate, a p-type semiconductor layer supported by the substrate, an n-type semiconductor layer arranged at a position farther from the substrate than the p-type semiconductor layer is and an active layer arranged between the p-type semiconductor layer and the n-type semiconductor layer. The n-type semiconductor layer is formed with a rectangular n-side electrode whose width in one direction is equal to that of the n-type semiconductor layer. The n-type semiconductor layer has a thickness t which satisfies Formula 4 given below:

$$t \geq \frac{\rho J_0 e}{4\gamma \kappa_B T} \cdot W(L - W) \quad \text{Formula 4}$$

where

L is width of the n-type semiconductor layer in a direction which is different from the one direction, T is absolute temperature, W is width of the n-side electrode in a direction which is different from the one direction, $J_0$ is current density at a contact portion between the n-side electrode and the n-type semiconductor layer, e is elementary charge, γ is diode ideality factor, $\kappa_B$ is Boltzmann constant, and ρ is specific resistance of the n-type semiconductor layer.

In a preferred embodiment, the n-type semiconductor layer is formed with a plurality of projections, and the thickness t of the n-type semiconductor layer satisfies Formula 5 instead of Formula 4:

$$t \geq \frac{\rho J_0 e}{4\gamma \kappa_B T} \cdot W(L - W) + x \quad \text{Formula 5}$$

where 0.1 μm ≦ x ≦ 3.0 μm.

In a preferred embodiment, the n-type semiconductor layer is made of n-GaN. With this arrangement, the semiconductor light emitting element is capable of emitting blue light or green light.

BEST MODE FOR CARRYING OUT THE INVENTION

Preferred embodiments of the present invention will be described below with reference to the accompanying drawings.

Figure 1:
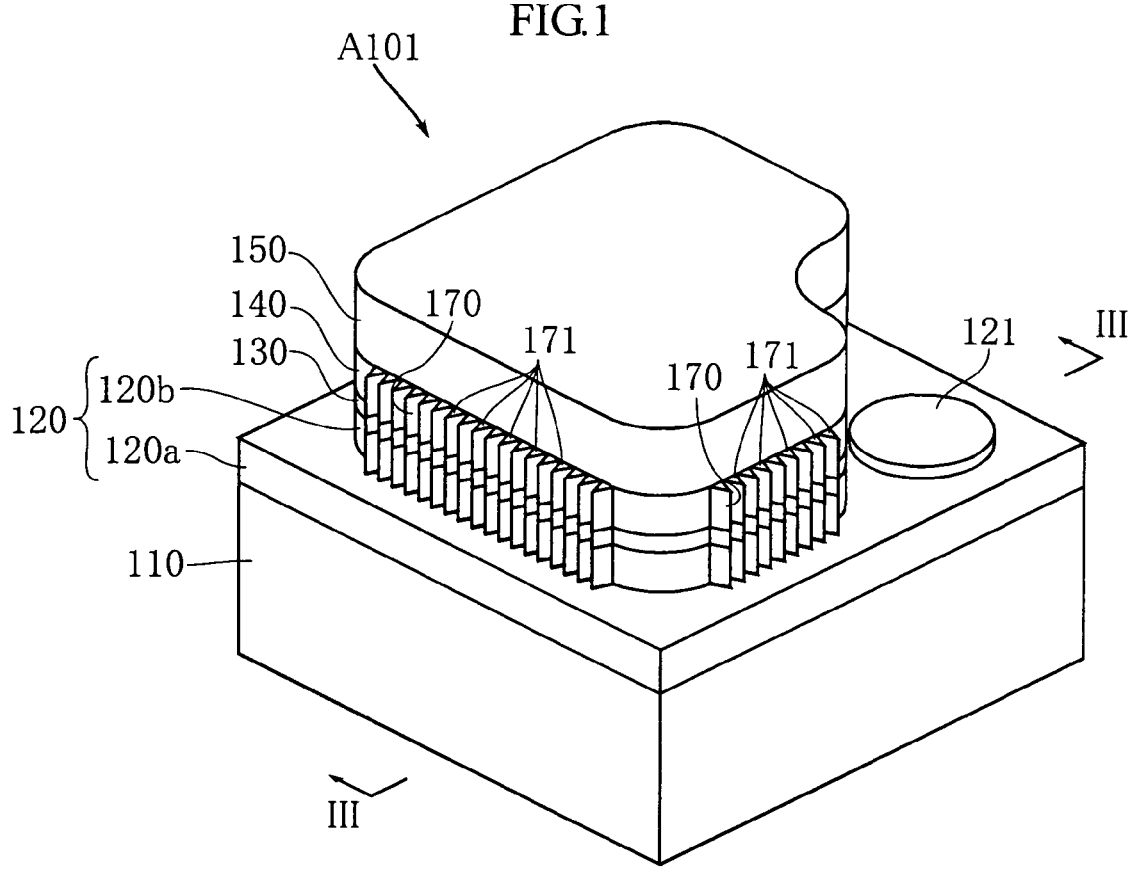
FIG. 1 is an overall perspective view showing a semiconductor light emitting element according to a first embodiment of the present invention.
Figure 2:
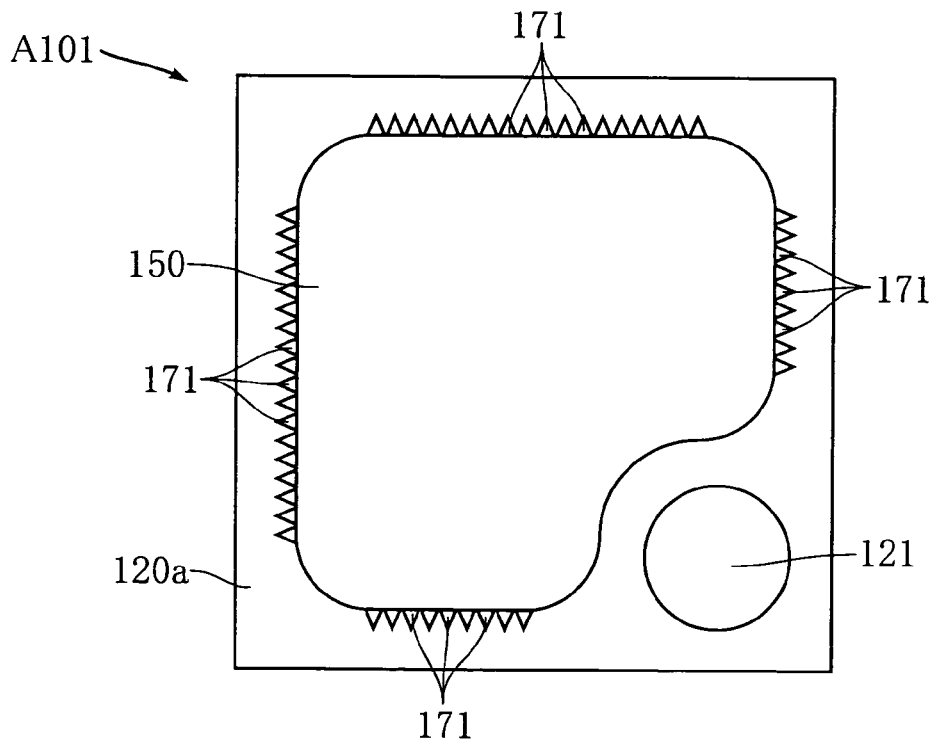
FIG. 2 is a plan view of the semiconductor light emitting element shown in FIG. 1.
Figure 3:
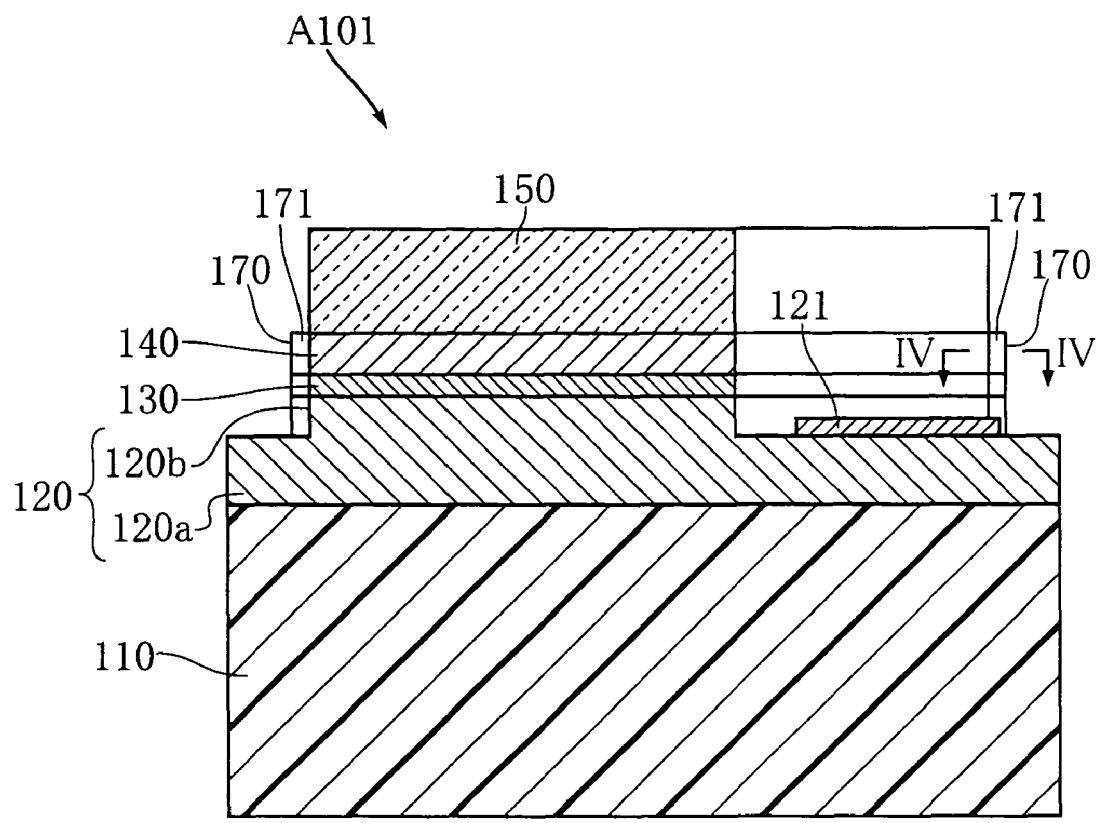
FIG. 3 is a sectional view taken along lines III-III in FIG. 1.

FIGS. 1-3 show a semiconductor light emitting element according to a first embodiment of the present invention. The semiconductor light emitting element A101 of this embodiment includes a substrate 110, an n-GaN layer 120, an active layer 130, a p-GaN layer 140 and a ZnO electrode 150. The semiconductor light emitting element A101 is particularly designed to emit blue light or green light.

The substrate 110 is made of e.g. sapphire and supports the n-GaN layer 120, the active layer 130, the p-GaN layer 140 and the ZnO electrode 150. In this embodiment, the substrate 110 has a thickness of about 80 μm. A buffer layer (not shown) made of e.g. AlN, GaN or AlGaN to alleviate lattice strain is formed on the substrate 110.

The n-GaN layer 120 is made of an n-type semiconductor formed by doping Si into GaN and an example of n-type semiconductor layer of the present invention. In this embodiment, the n-GaN layer 120 has a thickness of about 3 to 6 μm. As shown in FIG. 3, the n-GaN layer 120 comprises a first layer 120a having a thickness of about 6 μm and the same size as that of the substrate 110 in plan view and a second layer 120b having a thickness of about 0.2 μm and a size smaller than that of the substrate 110 in plan view. The upper surface of the first layer 120a is formed with an n-side electrode 121. The n-side electrode 121 may be formed by laminating a Ti film having a thickness of about 100 Å and an Al film having a thickness of about 2500 Å.

The active layer 130 has an MQW structure containing e.g. InGaN and serves to amplify the light emitted by the recombination of electrons and holes. The active layer 130 is made up of a plurality of InGaN layers and a plurality of GaN layers which are alternately laminated. The In composition ratio in the InGaN layers is about 17%, so that the band gap is smaller than that of the n-GaN layer 120. Thus, the InGaN layers constitute well layers of the active layer 130. The GaN layers constitute the barrier layers of the active layer 130. In the active layer 130 of this embodiment, eight InGaN layers each having a thickness of about 30 Å and eight GaN layers each having a thickness of about 100 Å are laminated so that the thickness of the active layer is about 0.1 μm. To alleviate the lattice strain, a superlattice layer (not shown) in which InGaN and GaN are laminated alternately for each atom is formed between the n-GaN layer 120 and the active layer 130.

The p-GaN layer 140 is made of a p-type semiconductor formed by doping Mg into GaN and an example of p-type semiconductor layer of the present invention. In this embodiment, the p-GaN layer 140 has a thickness of about 0.2 μm. A GaN layer (not shown) or an InGaN layer (not shown) whose In composition ratio is about 0.1% is formed between the active layer 130 and the p-GaN layer 140.

The ZnO electrode 150 is made of ZnO which is a transparent conductive oxide and allows the light from the active layer 130 to pass therethrough. Due to the doping of Ga into ZnO, the ZnO electrode 150 has a relatively low resistivity of about $2 \times 10^{-4}$ Ωcm. The thickness of the ZnO electrode is about 0.1 to 2 μm.

The side surface 170 of the lamination of the second layer 120b of the n-GaN layer 120, active layer 130 and p-GaN layer 140 is formed with a plurality of projections 171. As shown in FIG. 1, each of the projections 171 extends in the direction in which the second layer 120b of the n-GaN layer 120, the active layer 130 and the p-GaN layer 140 are laminated and is triangular in cross section. As shown in FIG. 2, the projections 171 are formed at flat portions of the side surface 170 and not formed at the curved portion of each corner.

Figure 4:
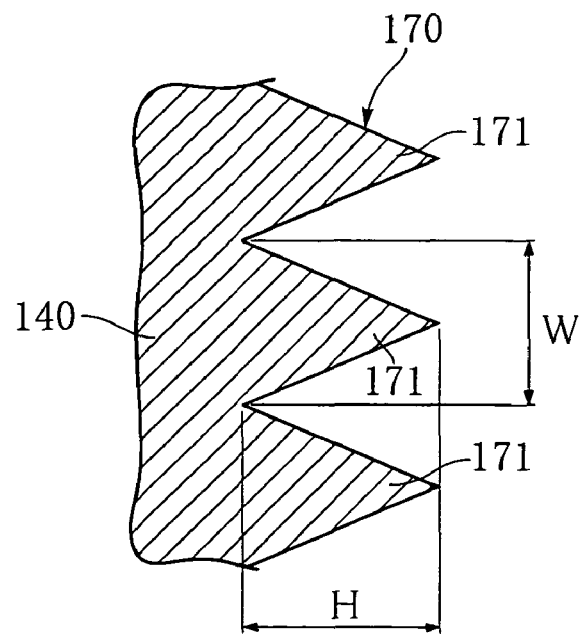
FIG. 4 is an enlarged sectional view of a principal portion taken along lines IV-IV in FIG. 3.

FIG. 4 is an enlarged sectional view showing the projections 171. When the wavelength of the light emitted from the active layer 130 is λ and the index of refraction of both the n-GaN layer 120 and the p-GaN layer 140 is n, the average $W_A$ of the widths W at the bottom of the projections 171 is set to satisfy $W_A \geq \lambda/n$. For instance, when the peak wavelength of the light emitted from the active layer 130, which includes InGaN layers as well layers, is 460 nm (blue) and the index of refraction n of the n-GaN layer 120 and the p-GaN layer 140 is about 2.5, the average width $W_A$ is to be about not less than 184 nm. When the well layers of the active layer 130 comprise GaN layers which emit light whose peak wavelength is not less than about 365 nm, the average width $W_A$ is about not less than 146 nm. In the present embodiment, each of the projections 171 has a height H of 2.5 μm, a width W of 2.1 μm and a vertex angle of 46°.

The semiconductor light emitting element A101 can be manufactured by a method described below.

First, a substrate 110 is placed in a film formation chamber for MOCVD, and the film formation temperature, i.e., the temperature in the film formation chamber is set to 1,100° C. In this state, $H_2$ gas and $N_2$ gas are supplied into the film formation chamber to clean the substrate 110.

Then, with the film formation temperature set to 1,060° C., $NH_3$ gas, $H_2$ gas, $N_2$ gas and trimethylgallium (hereinafter referred to as "TMG") gas are supplied into the film formation chamber. At the same time, $SiH_4$ gas is supplied to perform doping of Si which is an n-type dopant. As a result, n-GaN layer 120 is formed on the substrate 110.

Then, with the film formation temperature set to the range of 700 to 800° C., e.g. about 76° C., $NH_3$ gas, $H_2$ gas, $N_2$ gas, triethylgallium (hereinafter referred to as "TEG") gas and trimethylindium (hereinafter referred to as "TMIn") gas are supplied into the film formation chamber. As a result, an InGaN layer as a well layer having an In composition ratio of about 17% is formed. After the formation of the well layer, $NH_3$ gas, $H_2$ gas, $N_2$ gas and TMG gas are supplied, with the film formation temperature set to 760° C., whereby a GaN layer as a barrier layer is formed. Then, the formation of an InGaN layer as a well layer and the formation of a GaN layer as a barrier layer are alternately performed until eight InGaN layers and eight GaN layers are formed. Thus, an active layer 130 having an MQW structure is obtained.

Then, with the film formation temperature set to 1,010° C., $NH_3$ gas, $H_2$ gas, $N_2$ gas and TMG gas are supplied. At the same time, $Cp_2Mg$ gas is supplied to perform doping of Mg, which is a p-type dopant. As a result, a p-GaN layer 140 is formed.

Then, a resist film is formed on the p-GaN layer 140 by photolithography. Specifically, the resist film is formed to have a shape suitable for forming the projections 171 shown in FIG. 2. Then, by utilizing the resist film as a mask, the p-GaN layer 140, the active layer 130 and the second layer 120b of the n-GaN layer 120 are subjected to etching, whereby the side surface 170 formed with the projections 171 is formed.

Then, a ZnO electrode 150 is formed on the p-GaN layer 140. Further, an n-side electrode 121 is formed on the first layer 120a of the n-GaN layer 120. Thus, the manufacture of the semiconductor light emitting element A101 is completed.

The advantages of the semiconductor light emitting element A101 will be described below.

In this embodiment, of the light rays emitted from the active layer 130, the light rays traveling sideways in FIGS. 1 and 3 directly or via the second layer 120b of the n-GaN layer 120 or the p-GaN layer 140 reach the projections 171. According to the studies by the inventors of the present invention, it is found that the ratio of the light rays emitted to the outside increases when the average width $W_A$ of the projections 171 satisfies the above-described relation $W_A \geq \lambda/n$. Specifically, in a semiconductor light emitting element whose side surface 170 is smooth, about 19.4% of the energy converted into light is emitted to the outside as light. On the other hand, in the semiconductor light emitting element A101 provided with the projections 171, about 23.9% of the energy is emitted to the outside. That is, owing to the provision of the projections 171 at the side surface 170, the semiconductor light emitting element A101 is capable of emitting a larger part of the light produced at the active layer 130 than a semiconductor light emitting element having a conventional structure. Thus, the semiconductor light emitting element A101 achieves high brightness.

Particularly, since the n-GaN layer 120 and the p-GaN layer 140 are made of GaN having a relatively high index of refraction of about 2.5, its critical angle with respect to air is small. Thus, when the side surface 170 is smooth, a large part of light is totally reflected, which hinders high brightness. In this embodiment, by employing the index of refraction of GaN as the index of refraction "n" in Formula $W_A \geq \lambda/n$, the light emission efficiency from the n-GaN layer 120 and the p-GaN layer 140 is enhanced.

Since the projections 171 have a uniform cross section in the lamination direction, they can be easily formed by the above-described etching, for example. Moreover, each of the projections 171 having a triangular cross section comprises a pair of surfaces inclined at a predetermined angle. Thus, the partial inclination angle of the side surface 170 is entirely uniform, which is suitable for emitting light uniformly from the semiconductor light emitting element A101.

FIGS. 5-9 show other embodiments of the present invention. In these figures, the elements which are identical or similar to those of the foregoing embodiment are designated by the same reference signs as those used for the foregoing embodiment.

Figure 5:
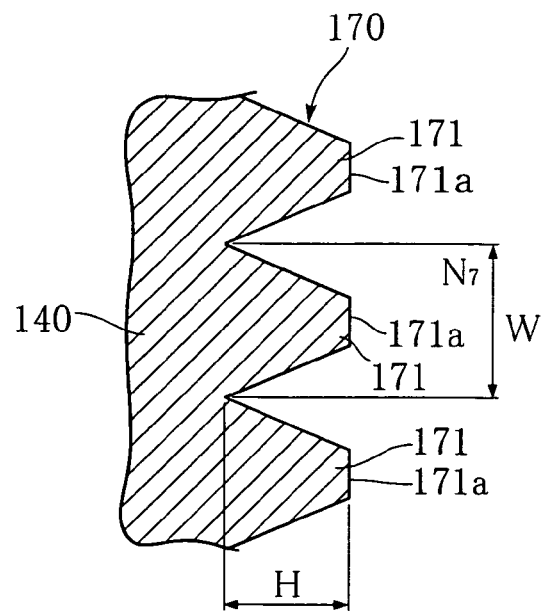
FIG. 5 is an enlarged sectional view showing a variation of projections.

FIG. 5 shows another example of projections 171. Each of the projections 171 shown in the figure has a shape obtained by removing the apex of the above-described projection 171 having a triangular cross section. That is, each projection 171 of this embodiment is in the form of a trapezoid having a top surface 171a in cross section. In this embodiment, the projection 171 has a width W of 2.1 μm and a height H of 2 μm. In this embodiment again, the efficiency of light emission from the second layer 120b of the n-GaN layer 120, the active layer 130 and the p-GaN layer 140 is enhanced.

Figure 6:
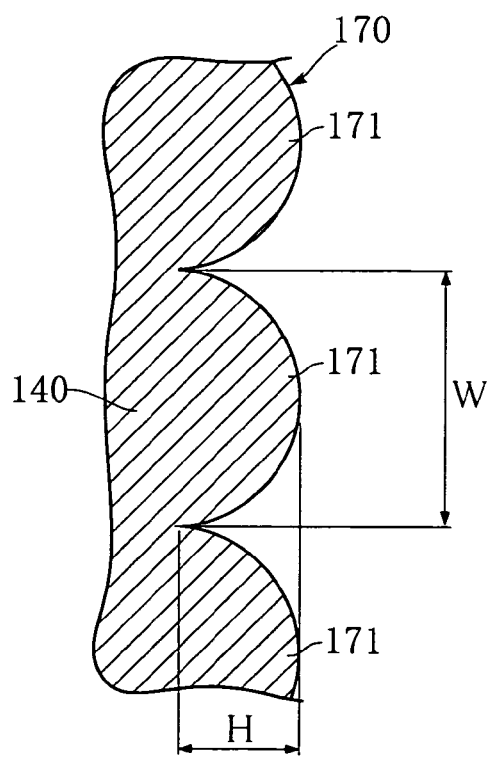
FIG. 6 is an enlarged sectional view showing another variation of projections.

FIG. 6 shows another example of projections 171. Unlike the foregoing examples, each projection 171 shown in the figure has a semicircular cross section. The projection 171 has a width W of 5.0 μm and a height H of 2.5 μm. By the provision of these projections 171, 23.8% of the energy was emitted as light from the second layer 120b of the n-GaN layer 120.

As will be understood from the foregoing embodiments, instead of the projections having a triangular cross section, projections having a trapezoidal cross section or a semicircular cross section may be employed in the present invention. Further, the projections are not limited to these shapes and may have other shapes as long as the average width of the projections satisfies the above-described requirement.

Figure 7:
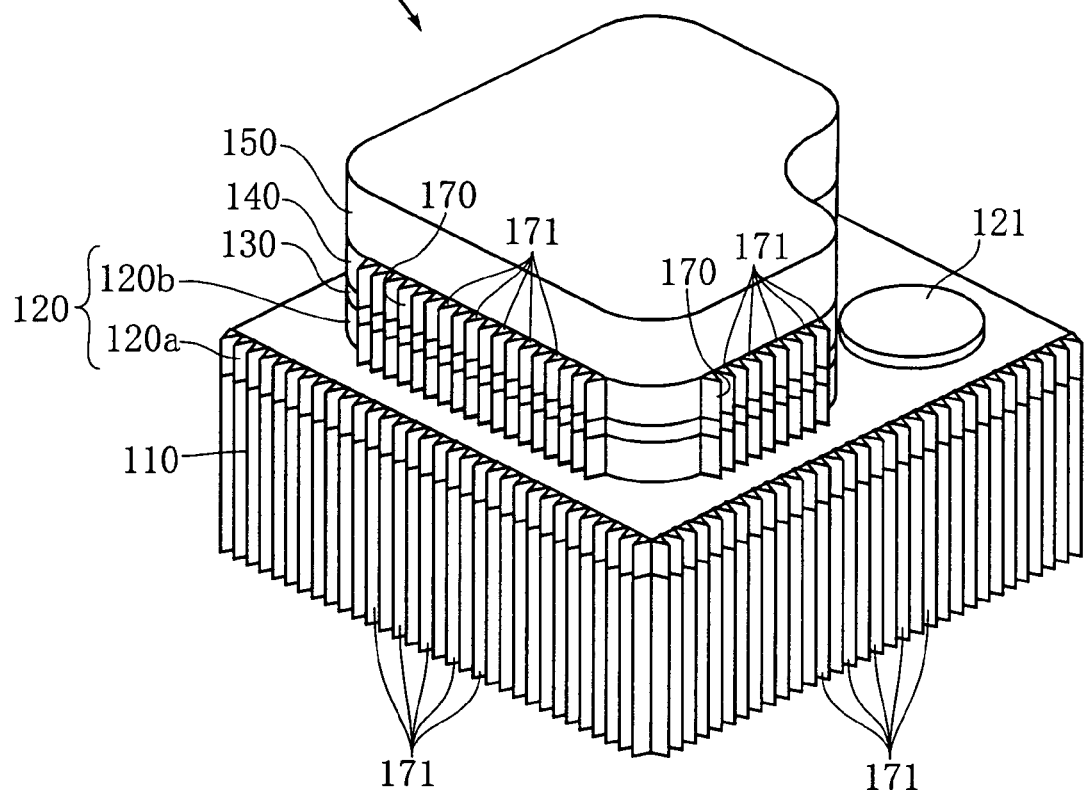
FIG. 7 is an overall perspective view showing a semiconductor light emitting element according to a second embodiment of the present invention.

FIG. 7 shows a semiconductor light emitting element according to a second embodiment of the present invention. The semiconductor light emitting element A102 of this embodiment differs from that of the foregoing embodiment in that a plurality of projections 171 are formed also on the substrate 110 and the first layer 120a of the n-GaN layer 120. The projections 171 of this embodiment have the same cross sectional configuration as that of the projections 171 shown in FIG. 4. The projections 171 can be formed by subjecting the substrate 110 and the n-GaN layer 120 to etching or dicing using a dicing blade formed with triangular grooves.

According to this embodiment, owing to the provision of the projections 171, the light traveling from the active layer 130 and reaching the first layer 120a of the n-GaN layer 120 and the substrate 110 through the second layer 120b of the n-GaN layer 120 is efficiently emitted. Thus, the semiconductor light emitting element A102 is capable of emitting a larger amount of light and achieves high brightness.

Figure 8:
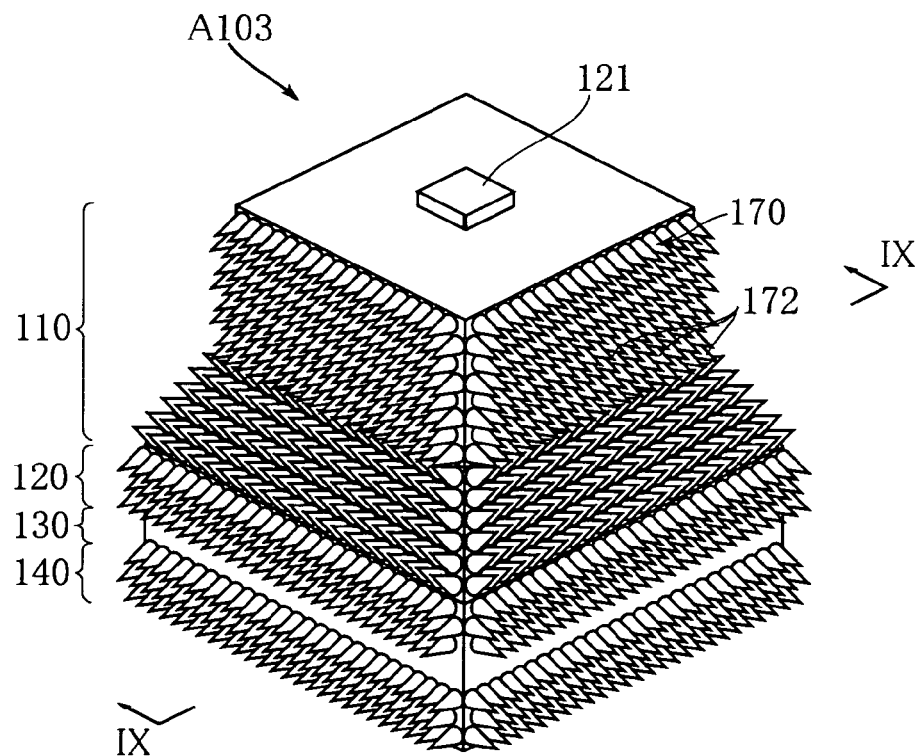
FIG. 8 is an overall perspective view showing a semiconductor light emitting element according to a third embodiment of the present invention.
Figure 9:
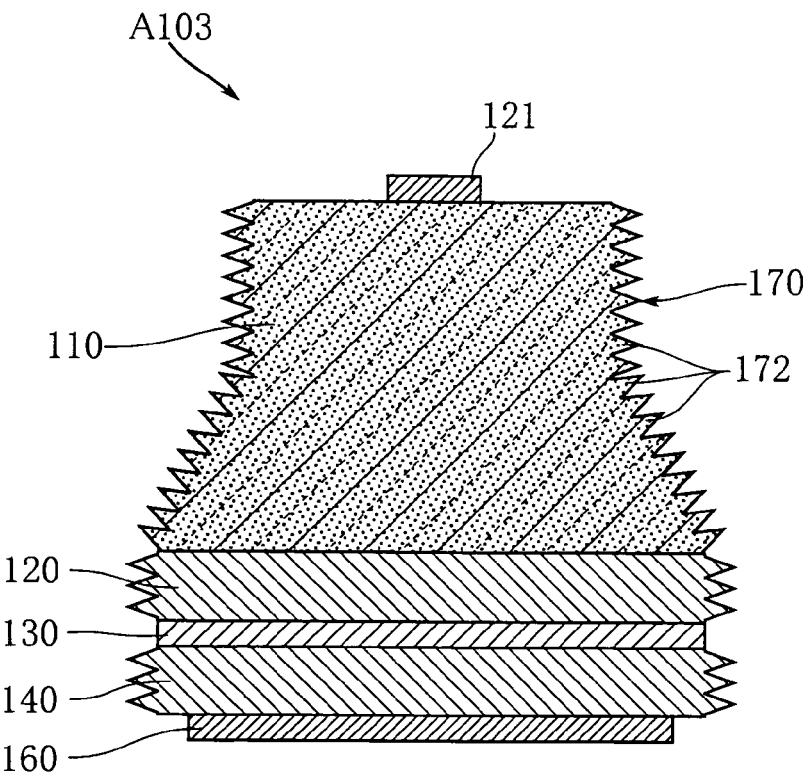
FIG. 9 is a sectional view taken along lines IX-IX in FIG. 8.

FIGS. 8 and 9 show a semiconductor light emitting element according to a third embodiment of the present invention. The semiconductor light emitting element A103 of this embodiment differs from those of the foregoing embodiments in that a plurality of cone-shaped projections 172 are provided. Further, the lamination structure of the semiconductor light emitting element A103 differs from that of the foregoing embodiments.

Specifically, the semiconductor light emitting element A103 includes a substrate 110, and an n-GaN layer 120, an active layer 130 and a p-GaN layer 140 which are laminated on one surface side of the substrate 110. The substrate 110 is made of SiC and includes a prismatic portion on the upper side in the figure and a tapered portion on the lower side in the figure. The surface of the substrate 110, which is opposite from the surface formed with the n-GaN layer 120, is formed with an n-side electrode 121. A reflective layer 160 is formed on the lower surface of the p-GaN layer 140. The reflective layer 160 may have a laminated structure made up of metal layers such as Al, Ti, Pt and Au layers, for example. In this embodiment, the top layer of the lamination of the reflective layer 160 in FIG. 9 comprises an Al layer. Since an Al layer has a relatively high reflectivity, the light emitted from the active layer 130 is properly reflected upward in the figure by the Al layer. The reflective layer 160 can be utilized as a p-side electrode.

The side surface 170 of the semiconductor light emitting element A103 is formed with a plurality of projections 172. However, of the side surface 170, the portion formed by the active layer 130 is not formed with the projections 172. Each of the projections 172 is in the form of a cone and has a height of about 2.5 μm and a width of about 2.1 μm. For instance, to form the projections 172, after the n-GaN layer 120, the active layer 130, and the p-GaN layer 140 are laminated on the substrate 110, the upper surface of the substrate 110, the lower surface of the p-GaN layer 140 and the active layer 130 are covered with a mask. Then, the laminated product is irradiated with ultraviolet (UV) rays of about 3.5 W/cm² for about 10 minutes while being immersed in about 4 mol/l of KOH solution of about 62° C. By this process, the projections 172 are formed.

The semiconductor light emitting element A103 of this embodiment also achieves high brightness. The utilization of a KOH solution and ultraviolet rays ensures that the projections 172 in the form of a cone are formed properly even when the substrate 110 includes a surface inclined in the lamination direction like this embodiment. To achieve the high brightness of the semiconductor light emitting element A103, it is preferable that at least the portion of the side surface 170 which is formed by the substrate 110 is formed, with the projections 172. By making the portion of the side surface 170 which is formed by the active layer 130 smooth, a large amount of light is emitted from the active layer 130.

As described above, by forming a plurality of projections whose average width satisfies the above-described requirement on a side surface of a semiconductor light emitting element, a larger part of the light produced at the active layer is emitted to the outside than in a conventional structure. Thus, the light emission amount of the semiconductor light emitting element increases, and hence, its brightness increases.

In the first and the second embodiments, the light emission efficiency is enhanced. However, since the n-side electrode 121 is formed on the upper surface of the first layer 120a of the n-GaN layer 120, sufficient current does not flow to a portion adjacent to the end of the n-GaN layer 120 which is away from the n-side electrode 121. As a result, it is difficult to cause the recombination of electrons and holes to occur at the entire region of the active layer 130. Thus, the efficient light emission for the power applied is difficult. This holds true for the third embodiment, because, also in the third embodiment, sufficient current does not flow to a portion adjacent to the end of the n-GaN layer 120 which is away from the n-side electrode 121.

The embodiments for solving this problem will be described below.

Figure 10:
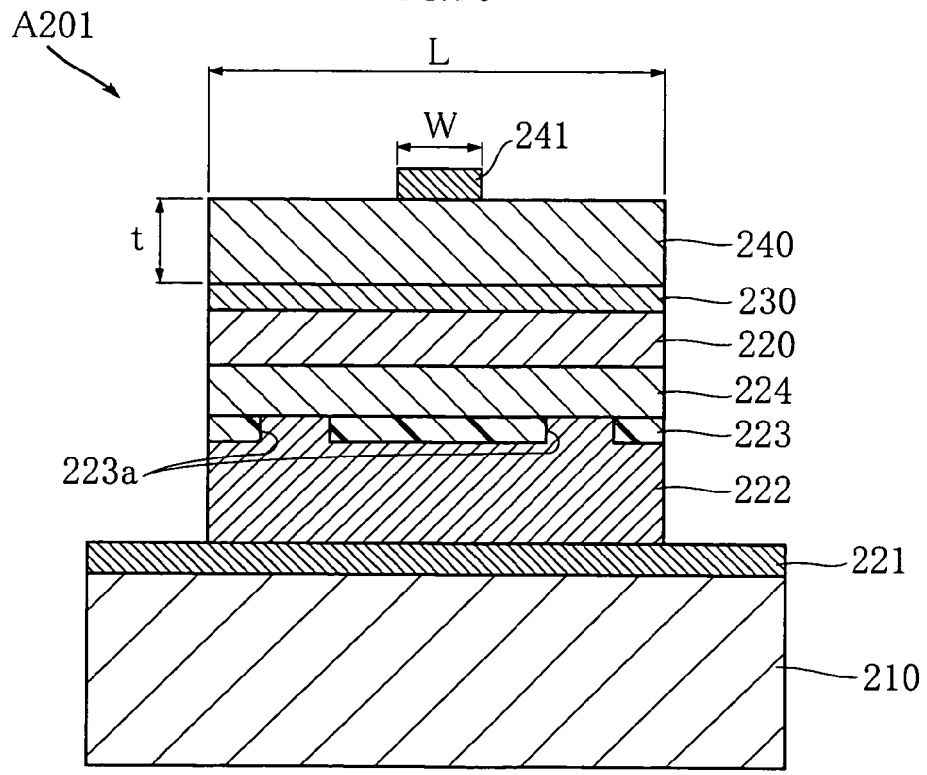
FIG. 10 is a sectional view showing a semiconductor light emitting element according to a fourth embodiment of the present invention.

FIG. 10 shows a semiconductor light emitting element according to a fourth embodiment of the present invention. The semiconductor light emitting element A201 of this embodiment includes a support substrate 210, a p-side electrode 221, a reflective layer 222, a mask layer 223, a ZnO electrode 224, a p-GaN layer 220, an active layer 230, an n-GaN layer 240 and an n-side electrode 241. The semiconductor light emitting element is designed to emit blue light or green light, for example. In this embodiment, the n-side electrode 241 is circular.

The support substrate 210 supports the p-side electrode 221, the reflective layer 222, the mask layer 223, the ZnO electrode 224, the p-GaN layer 220, the active layer 230, the n-GaN layer 240 and the n-side electrode 241. The support substrate 210 is made of a material having a high thermal conductivity such as Cu or AlN, for example. Thus, the support substrate 210 functions to dissipate the heat generated due to the energization of the semiconductor light emitting element A201 to the outside.

The p-side electrode 221 is formed on the entire upper surface of the support substrate 210 in the figure. The p-side electrode 221 may be made of Au—Sn or Au, for example.

The reflective layer 222 has a laminated structure made up of e.g. an Al layer, a Ti layer, a Pt layer and an Au layer arranged in the mentioned order from the upper side in the figure. Owing to the inclusion of an Al layer having a relatively high reflectivity, the reflective layer 222 reflects the light emitted from the active layer 230 upward in the figure. The reflective layer 222 electrically connects the p-side electrode 221 and the ZnO electrode 224 to each other. Ag may be employed instead of Al.

The mask layer 223 is used as an etching mask in etching the ZnO electrode 224, the p-GaN layer 220, the active layer 230 and the n-GaN layer 240 in the process of manufacturing the semiconductor light emitting element A201, which will be described later. For instance, the mask layer 223 is made of a dielectric material such as $SiO_2$. The mask layer 223 is formed with a plurality of through-holes 223a. The through-holes 223a provide communication between the reflective layer 222 and the ZnO electrode 224 so that the reflective layer and the ZnO electrode are electrically connected to each other. In this embodiment, the through-holes 223a are arranged on a circle having a center located directly below the n-side electrode 241.

The ZnO electrode 224 is made of ZnO which is a transparent conductive oxide. The ZnO electrode allows the light from the active layer 230 to pass therethrough and electrically connects the n-GaN layer 240 and the reflective layer 222 to each other. The ZnO electrode 224 has a relatively low resistivity of about $2\times10^{-4}$ Ωcm and a thickness of about 1000 to 20000 Å.

The p-GaN layer 220 is made of GaN doped with Mg, which is a p-type dopant, and an example of p-type semiconductor layer of the present invention. An undoped GaN layer (not shown) or an InGaN layer (not shown) containing about 1% of In is formed between the p-GaN layer 220 and the active layer 230.

The active layer 230 has an MQW structure containing InGaN and serves to amplify the light emitted by the recombination of electrons and holes. The active layer 230 has a laminated structure made up of a plurality of InGaN layers. Specifically, the active layer comprises two kinds of InGaN layers, i.e., those having the composition represented by $In_xGa_{1-x}N$ ($0 \leq x \leq 0.3$) and those having the composition represented by $In_yGa_{1-y}N$ ($0 \leq Y \leq 0.1$ and $Y \leq X$). The $In_xGa_{1-x}N$ layers are well layers, whereas the $In_yGa_{1-y}N$ layers are barrier layers. The well layers and the barrier layers are alternately laminated. A superlattice layer (not shown) made of GaN and InGaN doped with Si is formed between the active layer 230 and the n-GaN layer 240.

The n-GaN layer 240 is made of GaN doped with Si, which is an n-type dopant, and an example of n-type semiconductor layer of the present invention. The n-GaN layer 240 is formed with an n-side electrode 241. The n-side electrode 241 has a laminated structure made up of e.g. an Al layer, a Ti layer and an Au layer or an Al layer, an Mo layer and an Au layer which are arranged in the mentioned order from the n-GaN layer 240 side.

Figure 11:
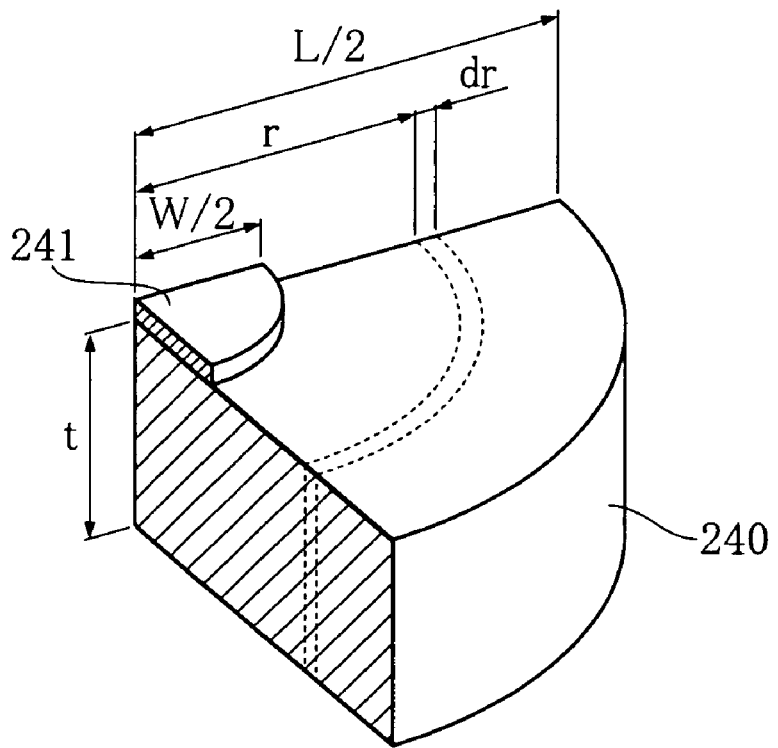
FIG. 11 is an enlarged perspective sectional view of a principal portion of the semiconductor light emitting element shown in FIG. 10.
Figure 12:
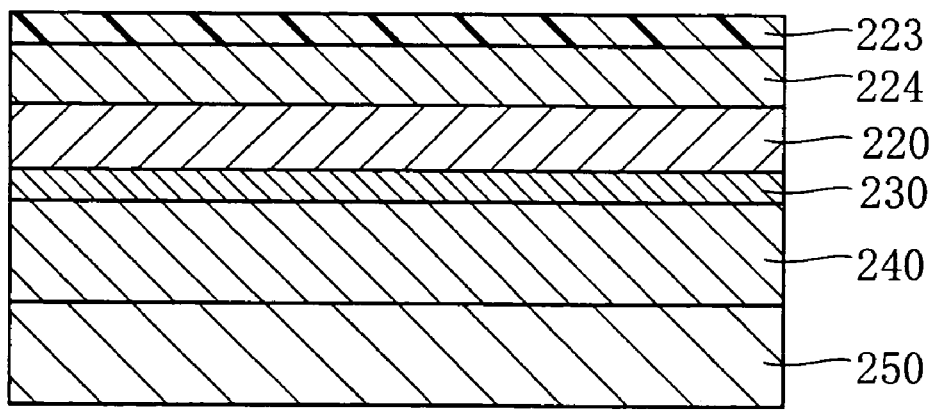
FIG. 12 is a sectional view showing the step of laminating a semiconductor layer on a sapphire substrate in a method for manufacturing the semiconductor light emitting element shown in FIG. 10.

The thickness t of the n-GaN layer 240 is determined in the manner described below with reference to FIG. 11. FIG. 11 is a perspective sectional view showing part of the n-GaN layer 240 and part of the n-side electrode 241 as enlarged. In this figure, the n-GaN layer 240 and the n-side electrode 241 are generally circular. First, the resistance dR when the current flows r→r+dr is given by Formula 6 below.

$$dR = \frac{\rho dr}{2\pi r \cdot t} \quad \text{Formula 6}$$

where ρ is the specific resistance of the n-GaN layer 240.

Now, the diameter of the n-GaN layer 240 in which the current density becomes 1/e as a result of the current flow from the end of the n-side electrode 241 to the end of the n-GaN layer 240 is expressed by L. Then, the resistance R from the end of the n-side electrode 241 to the end of the n-GaN layer 240 is obtained by the following Formula 7:

$$R = \int_{W/2}^{L/2} \frac{\rho \, dr}{2\pi r \cdot t} = \frac{\rho}{2\pi t} \log\left(\frac{L}{W}\right) \quad \text{Formula 7}$$

where W is the diameter of the n-side electrode 241.

Now, the current density directly under the n-side electrode 241 is expressed by $J_0$. Then, the current I that flows from the n-side electrode 241 through the n-GaN layer 240 is represented by the following Formula 8.

$$I = J_0 \pi \left(\frac{W}{2}\right)^2 \quad \text{Formula 8}$$

According to the forward-bias current-voltage characteristics of a semiconductor including a pn junction, the current I is represented by the following Formula 9.

$$I = J_0 \exp\left(-\frac{eV}{\gamma \kappa_B T}\right) \quad \text{Formula 9}$$

where V is the voltage, γ is the ideality factor of the semiconductor light emitting element, $\kappa_B$ is the Boltzmann constant and T is the absolute temperature. For instance, the ideality factor γ of GaN is generally about 2 to 3. However, the ideality factor varies depending on the state of crystal growth of GaN, for example.

Based on Formula 9, the voltage V by which the current I becomes 1/e is represented by the following Formula 10:

$$V = \frac{\gamma \kappa_B T}{e} \quad \text{Formula 10}$$

By replacing Ohm's law IR=V by Formulae 7, 8 and 10, the following Formula 11 is obtained. Thus, the thickness t necessary for making the current be 1/e is represented by the following Formula 12.

$$\frac{\rho}{2\pi t} \log\left(\frac{L}{W}\right) \cdot J_0 \pi \left(\frac{W}{2}\right)^2 = \frac{\gamma \kappa_B T}{e} \quad \text{Formula 11}$$

$$t = \frac{e}{\gamma \kappa_B T} \cdot \frac{\rho}{2\pi} \log\left(\frac{L}{W}\right) \cdot J_0 \pi \left(\frac{W}{2}\right)^2 \quad \text{Formula 12}$$

From the above, to sufficiently spread the current in the n-GaN layer 240 in the in-plane direction, it is necessary that the thickness t satisfies the relation represented by the following Formula 13.

$$t \geq \frac{\rho J_0 e W^2}{8 \gamma \kappa_B T} \cdot \log\left(\frac{L}{W}\right) \quad \text{Formula 13}$$

The "representative length" of the n-type semiconductor layer in the present invention refers to the diameter in the case where the semiconductor layer is circular and the length of one side in the case where the semiconductor layer is rectangular. In this embodiment, the diameter W of the n-side electrode 241 is about 100 μm, and the diameter or the length L of one side of the n-GaN layer 240 is about 250 μm. Thus, provided that the specific resistance ρ is $7.8 \times 10^{-5}$ Ωcm, the current density $J_0$ is $2.5 \times 10^6$ A/m², the ideality factor γ is 2 and the Boltzmann constant $\kappa_B$ is $1.38 \times 10^{-23}$ J/K mol, the thickness t of the n-GaN layer 240 needs to be not less than 1.1 μm.

A method for manufacturing the semiconductor light emitting element A201 will be described below with reference to FIGS. 12-15.

First, a sapphire substrate 250 is placed in a film formation chamber for MOCVD. Then, the sapphire substrate 250 is cleaned by supplying $H_2$ gas into the film formation chamber while keeping the temperature in the chamber at about 1,050° C.

Then, with the film formation temperature, i.e., the temperature in the film formation chamber set to about 600° C., a GaN buffer layer (not shown) is formed on the sapphire substrate 250 by MOCVD. Then, with the film formation temperature set to about 1,000° C., an n-GaN layer 240 containing Si as the dopant, a superlattice layer (not shown) of InGaN-GaN containing Si as the dopant, an MQW active layer 230 and an undoped GaN layer or an InGaN layer (not shown) containing about 1% of In are successively laminated. Then, with the film formation temperature slightly raised, a p-GaN layer 220 containing Mg as the dopant is formed. The p-GaN layer 220 is subjected to annealing for activating Mg. Then, a ZnO electrode 224 is formed by MBE (Molecular Beam Epitaxy). Thereafter, a mask layer 223 of $SiO_2$ is formed.

Figure 13:
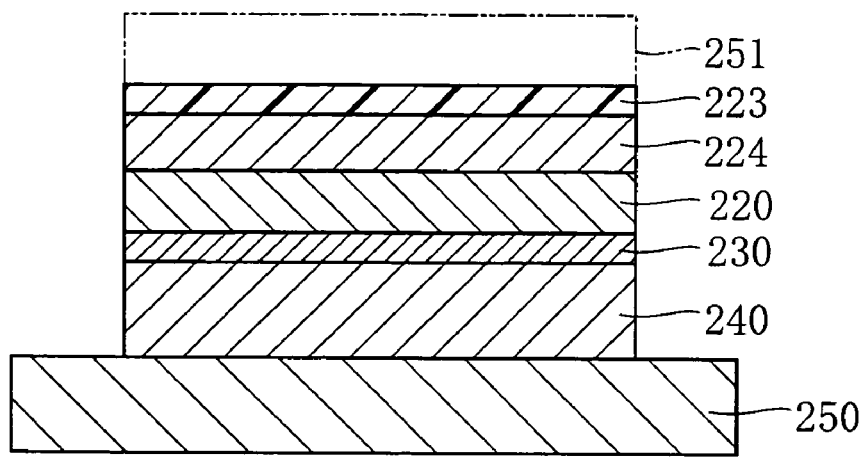
FIG. 13 is a sectional view showing the step of etching a semiconductor layer in a method for manufacturing the semiconductor light emitting element shown in FIG. 10.

Then, as shown in FIG. 13, a resist film 251 is formed by photolithography. Thereafter, the mask layer 223 is subjected to etching for patterning using the resist film 251 as a mask. Then, the resist film 251 is removed. By ICP (inductively coupled plasma) etching using the mask layer 223, the layers from the ZnO electrode 224 to the n-GaN layer 240 are subjected to mesa etching.

Figure 14:
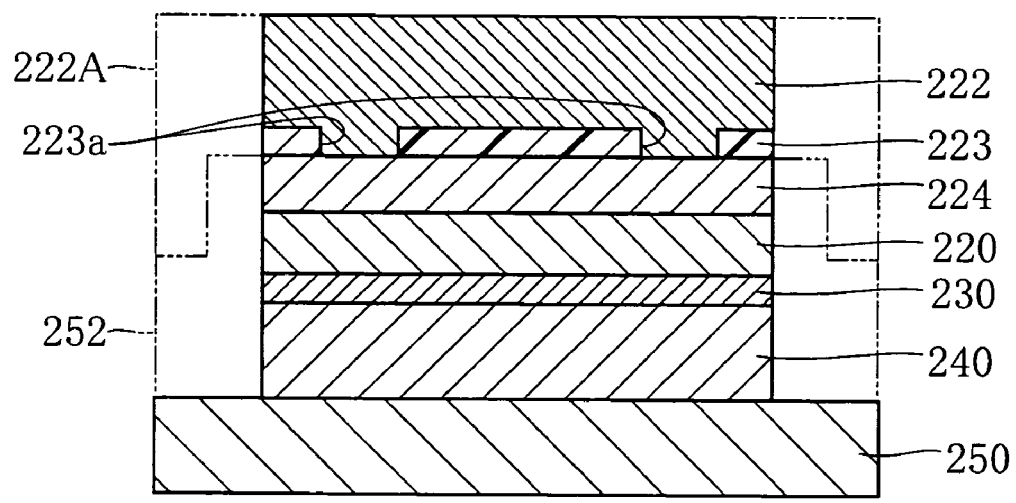
FIG. 14 is a sectional view showing the step of forming a reflective layer in a method for manufacturing the semiconductor light emitting element shown in FIG. 10.

Then, as shown in FIG. 14, by dry etching using $CF_4$ gas, a pattern is formed on the mask layer 223. In this patterning, a plurality of through-holes 223a for bringing a reflective layer 222 into contact with the ZnO electrode 224 are formed on a circle in the mask layer 223. In this process, the ZnO electrode 224 functions as the etching stopper. After the through-holes 223a are formed, a resist film 252 is formed. Further, by the vapor deposition of Al or Ag and the successive lamination of Ti, Pt and Au, a metal layer 222A is formed. Then, by removing the resist film 252 and part of the metal layer 222A, a reflective layer 222 is formed.

Figure 15:
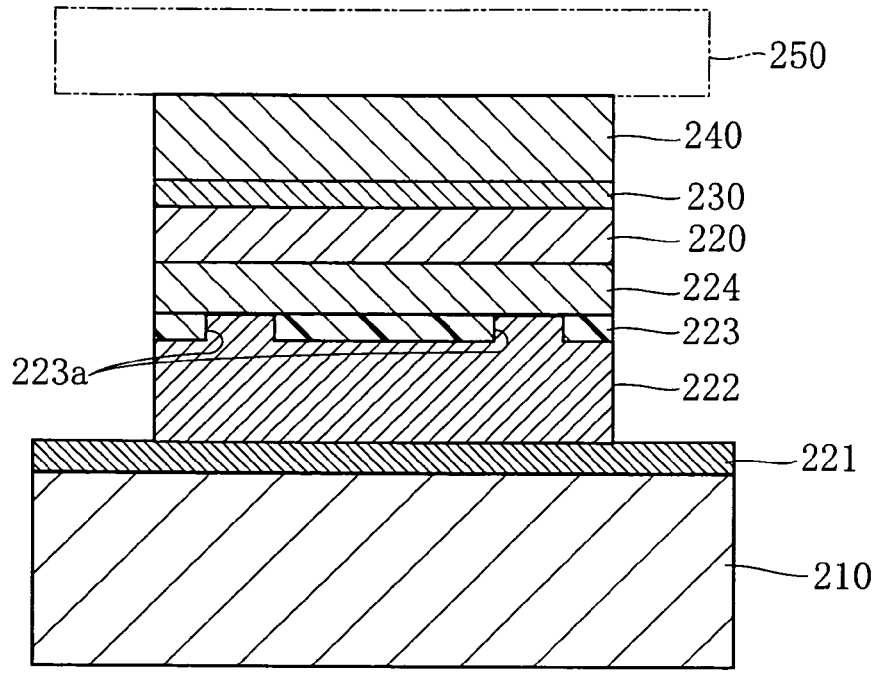
FIG. 15 is a sectional view showing the step of removing the sapphire substrate in a method for manufacturing the semiconductor light emitting element shown in FIG. 10.

Then, as shown in FIG. 15, a support substrate 210 is prepared. A p-side electrode 221 of Au—Sn or Au is formed on the support substrate 210. Then, the p-side electrode 221 and the reflective layer 222 are bonded together by thermocompression. Then, the n-GaN layer is irradiated with KrF laser having a wavelength of about 248 nm via the sapphire substrate 250. By this process, the interface (the above-described GaN buffer layer (not shown)) between the sapphire substrate 250 and the n-GaN layer 240 is rapidly heated. As a result, the n-GaN layer 240 and the above-described GaN buffer layer adjacent to the interface melt, whereby the sapphire substrate 250 is removed. This process is generally called LLO (Laser Lift Off) process.

Then, a metal layer (not shown) made up of Al, Ti, Au or Al, Mo, Au is formed on the n-GaN layer 240. By patterning the metal layer, an n-side electrode 241 shown in FIG. 10 is formed. By the above-described process steps, a semiconductor light emitting element A201 is obtained.

The advantages of the semiconductor light emitting element A201 will be described below.

In this embodiment, the thickness t of the n-GaN layer 240 satisfies the relation of Formula 13 mentioned above. This arrangement ensures that the current from the n-side electrode 241 spreads sufficiently in the in-plane direction of the n-GaN layer 240 before the current passes through the n-GaN layer 240 in the thickness direction. Thus, the current flows through the entirety of the n-GaN layer 240, the active layer 230 and the p-GaN layer 220. As a result, the entirety of the active layer 230 is utilized for light emission, so that the semiconductor light emitting element A201 emits a large amount of light.

Moreover, in the semiconductor light emitting element A201, current flows through the n-side electrode 241 and the through-holes 223a. As noted before, the through-holes 223a are arranged on a circle having a center located directly under the n-side electrode 241. With this arrangement, the current flowing in the semiconductor light emitting element A201 is likely to spread in the width direction of the semiconductor light emitting element A201. Thus, the light emission from the entirety of the active layer 230 is further promoted.

Figure 16:
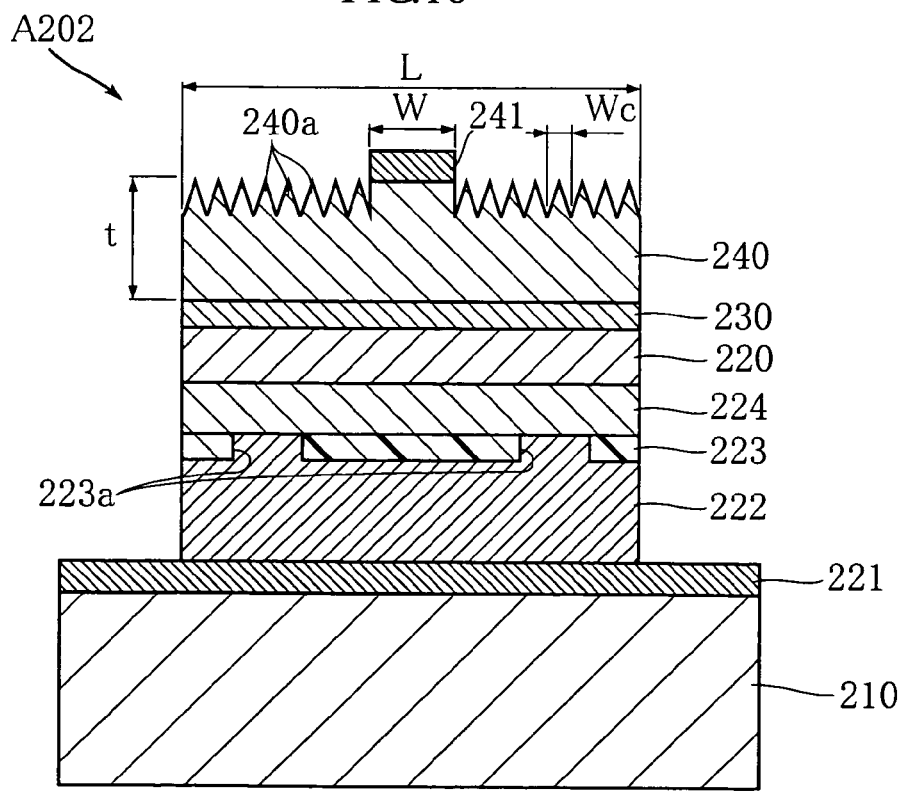
FIG. 16 is a sectional view showing a semiconductor light emitting element according to a fifth embodiment of the present invention.
Figure 17:
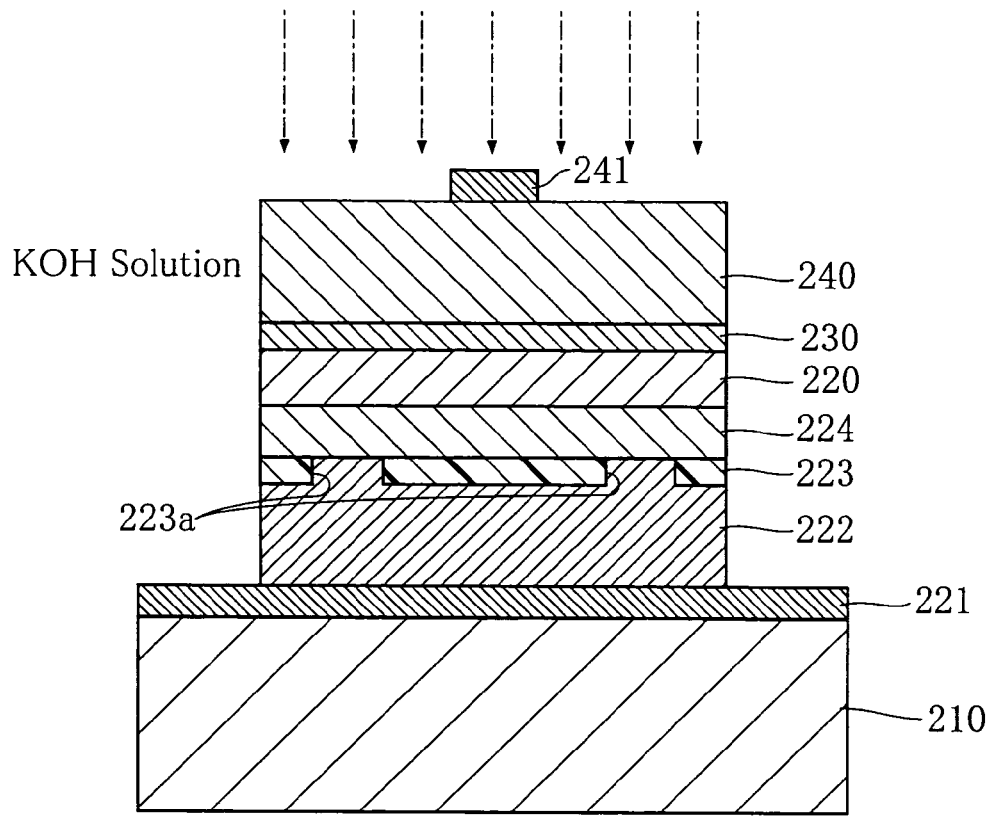
FIG. 17 is a sectional view showing the step of forming a plurality of projections in a method for manufacturing the semiconductor light emitting element shown in FIG. 16.

FIGS. 16 and 17 show a semiconductor light emitting element according to a fifth embodiment of the present invention and a method for manufacturing the semiconductor light emitting element. In these figures, the elements which are identical or similar to those of the foregoing embodiments are designated by the same reference signs as those used for the foregoing embodiments.

In the semiconductor light emitting element A202 shown in FIG. 16, the upper surface of the n-GaN layer 240 is formed with a plurality of projections 240a. The projections 240a are in the form of a cone. In this embodiment, when the peak wavelength of the light emitted from the active layer 230 is λ and the index of refraction of the n-GaN layer 240 is n, the average Wc' of the widths Wc at the bottom of the projections 240a satisfies Wc'≧λ/n. For instance, when the peak wavelength of the light emitted from the active layer 230 is 460 nm and the index of refraction n of the n-GaN layer 240 is about 2.5, the average width Wc' is about not less than 184 nm. In this embodiment, the height of each projection 240a is about 2 μm.

In the semiconductor light emitting element A202, the thickness t of the n-GaN layer 240 satisfies the relation represented by following Formula 14.

$$t \geq \frac{\rho J_0 e W^2}{8 \gamma \kappa_B T} \cdot \log\left(\frac{L}{W}\right) + x \qquad \text{Formula 14}$$

where 0.1 μm≦x≦3.0 μm.

Formula 14 is obtained by adding the term (+x) to the right side of Formula 13. The addition of x corresponds to the height of each projection 240a.

To manufacture the semiconductor light emitting element A202, in the above-described state shown in FIG. 15, an n-side electrode 241 is formed, as shown in FIG. 17. In FIG. 15, the surface of the n-GaN layer 240 after the sapphire substrate 250 is removed is not a Ga-polarity surface but an N-polarity surface in which anisotropy is likely to be generated by etching. In this state, as shown in FIG. 17, the n-GaN layer 240 is irradiated with ultraviolet (UV) rays of about 3.5 W/cm² for about 10 minutes while being immersed in about 4 mol/l of KOH solution of about 62° C. By this process, a plurality of projections 240a whose average Wc' of the bottom widths Wc satisfies the above-described relation are formed on the surface of the n-GaN layer 240. Further, as a result of the formation of the projections, the thickness t of the n-GaN layer 240 satisfies the relation of Formula 14 mentioned above.

In this embodiment again, a large amount of light is emitted from the active layer 230. Further, by the formation of the projections 240a on the surface of the n-GaN layer 240, the light from the active layer 230 is prevented from being totally reflected by the surface of the n-GaN layer 240 to return into the n-GaN layer 240. Thus, the light emission amount of the semiconductor light emitting element A202 increases.

Figure 18:
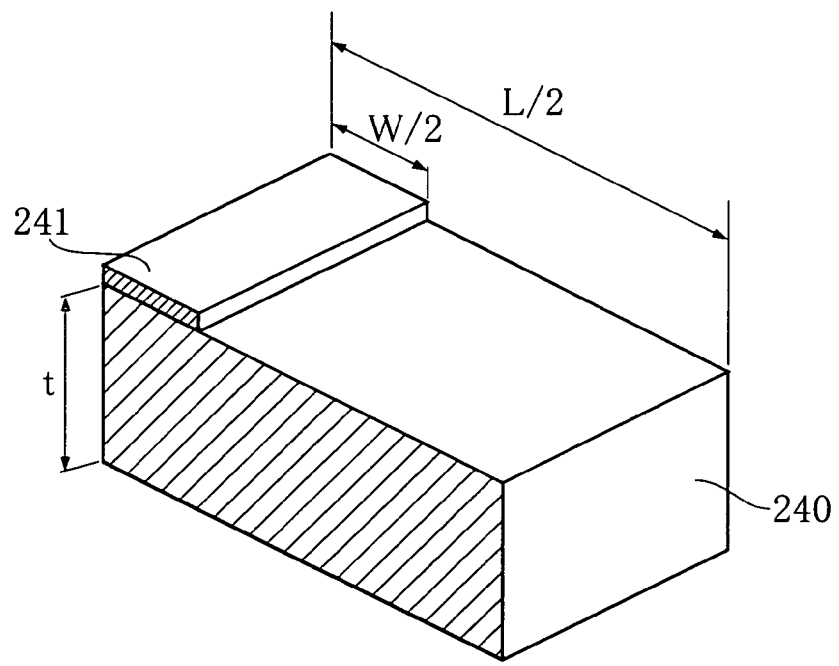
FIG. 18 is an enlarged perspective sectional view showing a principal portion of a semiconductor light emitting element according to a sixth embodiment of the present invention.

An n-side electrode 241 which is different from those of the foregoing embodiments in shape and size will be described below. In this sixth embodiment, the cross sectional configuration is the same as that shown in FIG. 10, and the n-side electrode 241 is rectangular. The width of the n-side electrode 241 in a predetermined direction (the direction perpendicular to the sheet surface of FIG. 10) is equal to that of the n-GaN layer 240. FIG. 18 is a perspective sectional view showing part of the n-side electrode 241 and part of the n-GaN layer 240 of the sixth embodiment as enlarged. In this embodiment, the thickness t (the dimension in the up-down direction in FIG. 10) of the n-GaN layer 240 is determined as follows.

First, an n-GaN layer 240 in which the current density becomes 1/e as a result of the current flow from the end of the n-side electrode 241 to the end of the n-GaN layer 240 is considered. Now, the width of the n-GaN layer 240 in a direction (the right and left direction in FIG. 10) which is different from the above-described predetermined direction is expressed by L, the width of the n-GaN layer 240 and the n-side electrode 241 in the above-described predetermined direction is expressed by y and the width of the n-side electrode 241 in a direction (the right and left direction in FIG. 10) which is different from the above-described predetermined direction is expressed by W. Then, the resistance R from the end of the n-side electrode 241 to the end of the n-GaN layer 240 is obtained by the following Formula 15.

$$R = \frac{\rho}{ty} \cdot \frac{L - W}{2} \qquad \text{Formula 15}$$

When the current density directly under the n-side electrode 241 is expressed by J₀, the current I that flows from the n-side electrode 241 through the n-GaN layer 240 is represented by the following Formula 16:

$$I = J_0 y \cdot \frac{W}{2} \qquad \text{Formula 16}$$

According to the forward-bias current-voltage characteristics of a semiconductor including a pn junction, the current I is represented by Formula 9 mentioned above. The voltage V by which the current I becomes 1/e is represented by Formula 10. By replacing Ohm's law IR=V by Formulae 15, 16 and 10, the following Formula 17 is obtained. Thus, the thickness t necessary for making the current be 1/e is represented by the following Formula 18.

$$\frac{\rho}{ty} \cdot \frac{L-W}{2} \cdot J_0 y \cdot \frac{W}{2} = \frac{\gamma \kappa_B T}{e} \quad \text{Formula 17}$$

$$t = J_0 \cdot \frac{W}{2} \cdot \frac{L-W}{2} \cdot \frac{e\rho}{\gamma \kappa_B T} \quad \text{Formula 18}$$

From the above, to sufficiently spread the current in the n-GaN layer 240 in the in-plane direction, it is necessary that the thickness t satisfies the relation represented by the following Formula 19:

$$t \geq \frac{\rho J_0 e}{4\gamma \kappa_B T} \cdot W(L-W) \quad \text{Formula 19}$$

In this structure in which the n-side electrode 241 is rectangular and has a width equal to that of the n-GaN layer 240, the upper surface of the n-GaN layer 240 may be formed with a plurality of projections 240a, similarly to the structure shown in FIG. 16. In this case, the thickness t of the n-GaN layer 240 is determined by the following Formula 20.

$$t \geq \frac{\rho J_0 e}{4\gamma \kappa_B T} \cdot W(L-W) + x \quad \text{Formula 20}$$

where $0.1\ \mu m \leq x \leq 3.0\ \mu m$

In these embodiments again, the current flowing through the n-GaN layer 240 spreads to the periphery of the n-GaN layer 240, whereby the light emission amount increases. As noted before, the light emission amount further increases when the projections 240a are provided.

As described above, by utilizing the physical properties of the material semiconductor, the thickness of the n-type semiconductor layer is determined to satisfy the relation expressed by Formula 2 or 5.

In the sixth embodiment, to reduce the amount of light totally reflected by a side surface of the semiconductor light emitting element, the side surface may be formed with a plurality of projections like the first or the third embodiment.

Figure 19:
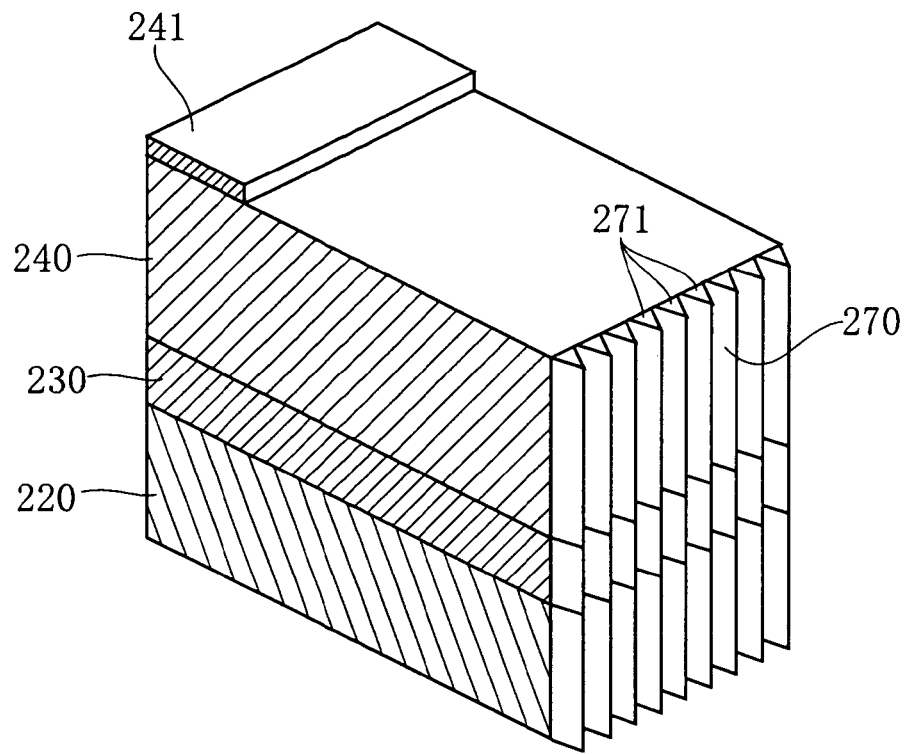
FIG. 19 is a sectional view showing a semiconductor light emitting element according to a seventh embodiment of the present invention.
Figure 20:
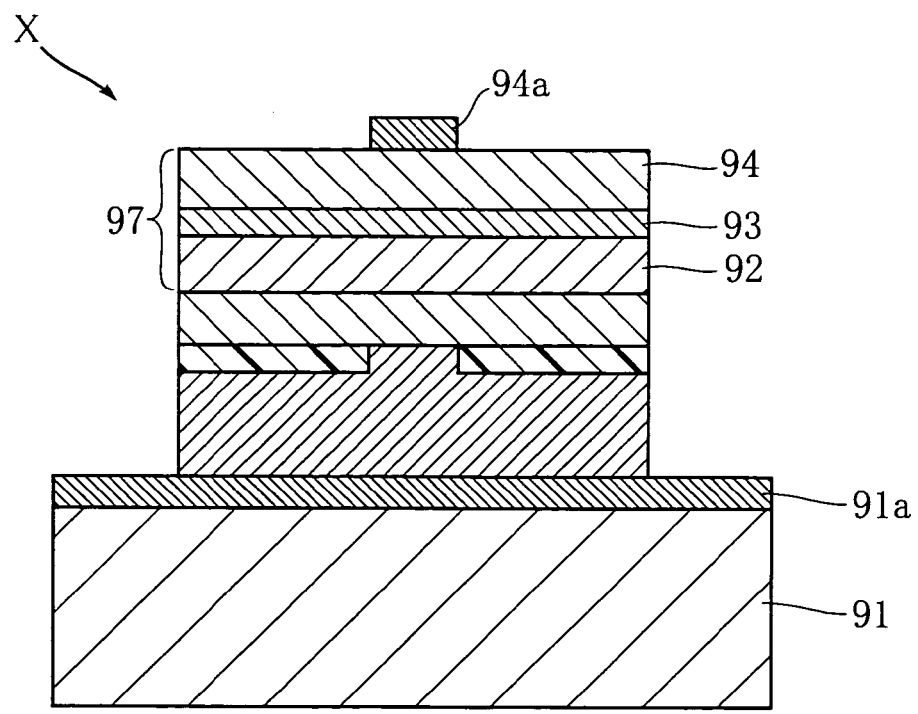
FIG. 20 is a sectional view showing an example of conventional semiconductor light emitting element.

FIG. 19 shows a semiconductor light emitting element according to a seventh embodiment of the present invention. Specifically, FIG. 19 is a perspective sectional view showing part of the n-side electrode 241, n-GaN layer 240, active layer 230 and p-GaN layer 220 as enlarged. In the semiconductor light emitting element of this embodiment, a plurality of projections 271, which are the same as those of the first embodiment, are formed on a side surface 270 of the n-GaN layer 240, active layer 230 and p-GaN layer 220, which have the same structure as that of the sixth embodiment.

According to this embodiment, in addition to the light emission amount of the semiconductor light emitting element, the amount of light emitted from the side surface 270 also increases, whereby the semiconductor light emitting element achieves high brightness.

The projections 271 may have any shape as long as the average width satisfies the requirement described in the first embodiment. Further, like the second embodiment, the projections 271 may be formed also on other layers. The semiconductor light emitting element may have a different lamination structure like that of the third embodiment. The upper surface of the n-GaN layer 240 may be formed with a plurality of projections 240a.

The semiconductor light emitting element according to the present invention is not limited to the foregoing embodiments. The specific structure of each part of the semiconductor light emitting element according to the present invention may be varied in design in many ways.

The n-type semiconductor layer and the p-type semiconductor layer of the present invention are not limited to an n-GaN layer and a p-GaN layer and may be other semiconductor layers as long as they are capable of injecting electrons and holes into an active layer. The active layer of the present invention is not limited to one having an MQW structure. The semiconductor light emitting element according to the present invention may be designed to emit white light or light of other wavelengths, instead of blue light or green light.

The invention claimed is:

1. A semiconductor light emitting element comprising:
 a substrate; and
 an n-type semiconductor layer, an active layer and a p-type semiconductor layer which are laminated on the substrate;
 wherein the semiconductor light emitting element includes a side surface extending in a lamination direction and constituted by the substrate, the n-type semiconductor layer, the active layer and the p-type semiconductor layer, the side surface being formed with a plurality of projections except for the active layer, the plurality of projections being provided on the substrate, the n-type semiconductor layer and the p-type semiconductor layer,
 wherein, when a wavelength of light emitted from the active layer is expressed by $\lambda$ and index of refraction of either one of the n-type semiconductor layer and the p-type semiconductor layer is expressed by n, average $W_A$ of widths at bottoms of the projections satisfies:

$W_A \geq \lambda/n$.

2. The semiconductor light emitting element according to claim 1, wherein at least one of the n-type semiconductor layer and the p-type semiconductor layer is made of GaN.

3. The semiconductor light emitting element according to claim 1, wherein the projections extend in the lamination direction and are triangular or semicircular in cross section.

4. The semiconductor light emitting element according to claim 1,
 wherein each of the plurality of projections includes a surface inclined with respect to the lamination direction.

5. The semiconductor light emitting element according to claim 4, wherein each of the plurality of projections is cone-shaped.

6. The semiconductor light emitting element according to claim 4, wherein the substrate includes a prismatic portion and a tapered portion.

* * * * *